(12) United States Patent
Chang et al.

(10) Patent No.: US 11,984,322 B2
(45) Date of Patent: *May 14, 2024

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Tien-Shun Chang, New Taipei (TW); Chun-Feng Nieh, Hsinchu (TW); Huicheng Chang, Tainan (TW); Yee-Chia Yeo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/738,030

(22) Filed: May 6, 2022

(65) Prior Publication Data

US 2022/0262644 A1    Aug. 18, 2022

Related U.S. Application Data

(63) Continuation of application No. 16/901,001, filed on Jun. 15, 2020, now Pat. No. 11,367,621.

(51) Int. Cl.
| | |
|---|---|
| *H01L 21/308* | (2006.01) |
| *G03F 1/38* | (2012.01) |
| *H01L 21/265* | (2006.01) |
| *H01L 21/311* | (2006.01) |
| *H01L 21/3115* | (2006.01) |
| *H01L 21/8234* | (2006.01) |
| *H01L 29/66* | (2006.01) |
| *H01L 21/768* | (2006.01) |

(52) U.S. Cl.
CPC ............ *H01L 21/3088* (2013.01); *G03F 1/38* (2013.01); *H01L 21/26586* (2013.01); *H01L 21/3086* (2013.01); *H01L 21/31111* (2013.01); *H01L 21/31155* (2013.01); *H01L 21/823431* (2013.01); *H01L 21/823468* (2013.01); *H01L 29/66545* (2013.01); *H01L 29/6656* (2013.01); *H01L 29/66795* (2013.01); *H01L 21/76816* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

FOREIGN PATENT DOCUMENTS

| | | | | |
|---|---|---|---|---|
| WO | WO2016067161 | * | 5/2016 | ............... G09F 9/00 |

*Primary Examiner* — Jiong-Ping Lu
(74) *Attorney, Agent, or Firm* — JCIPRNET

(57) ABSTRACT

A manufacturing method of a semiconductor device, comprises the following steps: providing a semiconductor substrate; forming a dummy insulation layer and a dummy electrode sequentially stacked on the semiconductor substrate; forming spacers on sidewalls of the dummy electrode; removing the dummy electrode to exposes inner sidewalls of the spacers; and performing an ion implantation process to the inner sidewalls of the spacers and the dummy insulation layer.

20 Claims, 18 Drawing Sheets

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 2018/0315605 | A1* | 11/2018 | Walther ............ H01L 21/26513 |
| 2019/0006242 | A1* | 1/2019 | Wang ................. H01L 27/0886 |

\* cited by examiner

SEMICONDUCTOR DEVICE AND MANUFACTURING METHOD THEREOF

CROSS-REFERENCE TO RELATED APPLICATION

This application is a continuation application of and claims the priority benefit of a prior application Ser. No. 16/901,001, filed on Jun. 15, 2020, now allowed. The entirety of the above-mentioned patent application is hereby incorporated by reference herein and made a part of this specification.

BACKGROUND

Semiconductor devices and integrated circuits (ICs) used in a variety of electronic apparatus, such as cell phones and other mobile electronic equipment, are typically manufactured on a single semiconductor wafer. The semiconductor device manufacturing industry has experienced exponential growth over the last few decades. As ICs have evolved, functional density (i.e., the number of semiconductor devices per chip area) has generally increased while geometry size (i.e., the smallest semiconductor device that can be created) has decreased. Some advancements in the evolution of ICs include embedded memory technology and high κ metal gate (HKMG) technology. Embedded memory technology is the integration of memory devices with logic devices on the same semiconductor chip, such that the memory devices support operation of the logic devices. High κ metal gate (HKMG) technology is the manufacture of semiconductor devices using metal gate electrodes and high-κ gate dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
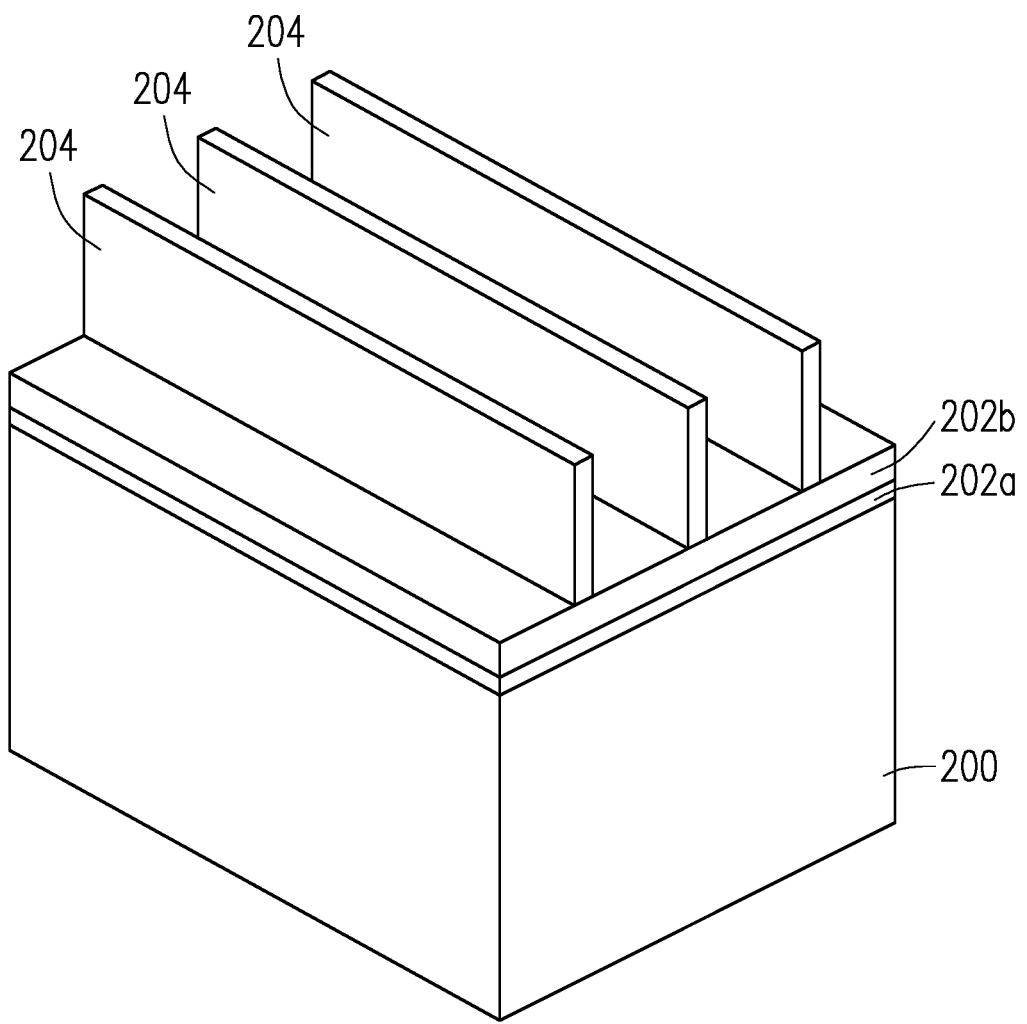
FIG. 1A to FIG. 1L are perspective views illustrating various stages of a method of manufacturing a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A is a perspective view illustrating one of various stages of a method of manufacturing a semiconductor device 10 in accordance with some embodiments of the present disclosure.

Referring to FIG. 1A, a semiconductor substrate 200 is provided. In some embodiments, the semiconductor substrate 200 may be a bulk semiconductor substrate, a semiconductor-on-insulator (SOI) substrate, or the like. Generally, an SOI substrate is a layer of a semiconductor material formed on an insulator layer. The insulator layer may be, for example, a buried oxide layer, a silicon oxide layer, or the like. The insulator layer is provided on a substrate, typically a silicon or glass substrate. Other substrates, such as a multi-layered or gradient substrate, may also be used.

In some embodiments, the semiconductor substrate 200 includes a crystalline silicon substrate (e.g., wafer). In some alternative embodiments, the semiconductor substrate 200 may be made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP. The semiconductor substrate 200 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or a combination thereof. Depending on the dopant type, an n-type FinFET or a p-type FinFET may be formed on the semiconductor substrate 200 in the subsequent processes. In some embodiments, the dopant concentration in various doped regions may be different.

In some embodiments, a pad layer 202a and a mask layer 202b are sequentially formed on the semiconductor substrate 200. The pad layer 202a may be a silicon oxide thin film formed by, for example, a thermal oxidation process. In some embodiments, the pad layer 202a may act as an adhesion layer between the semiconductor substrate 200 and the mask layer 202b. In some embodiments, the pad layer 202a may also act as an etch stop layer for etching the mask layer 202b. In some embodiments, the mask layer 202b may be a silicon nitride layer formed by low-pressure chemical vapor deposition (LPCVD) or plasma enhanced chemical vapor deposition (PECVD). In some alternative embodiments, the mask layer 202b may be formed by thermal nitridation of silicon. The mask layer 202b is used as a hard mask during subsequent photolithography processes. A patterned photoresist layer 204 having a predetermined pattern is formed on the mask layer 202b.

Figure 1B:
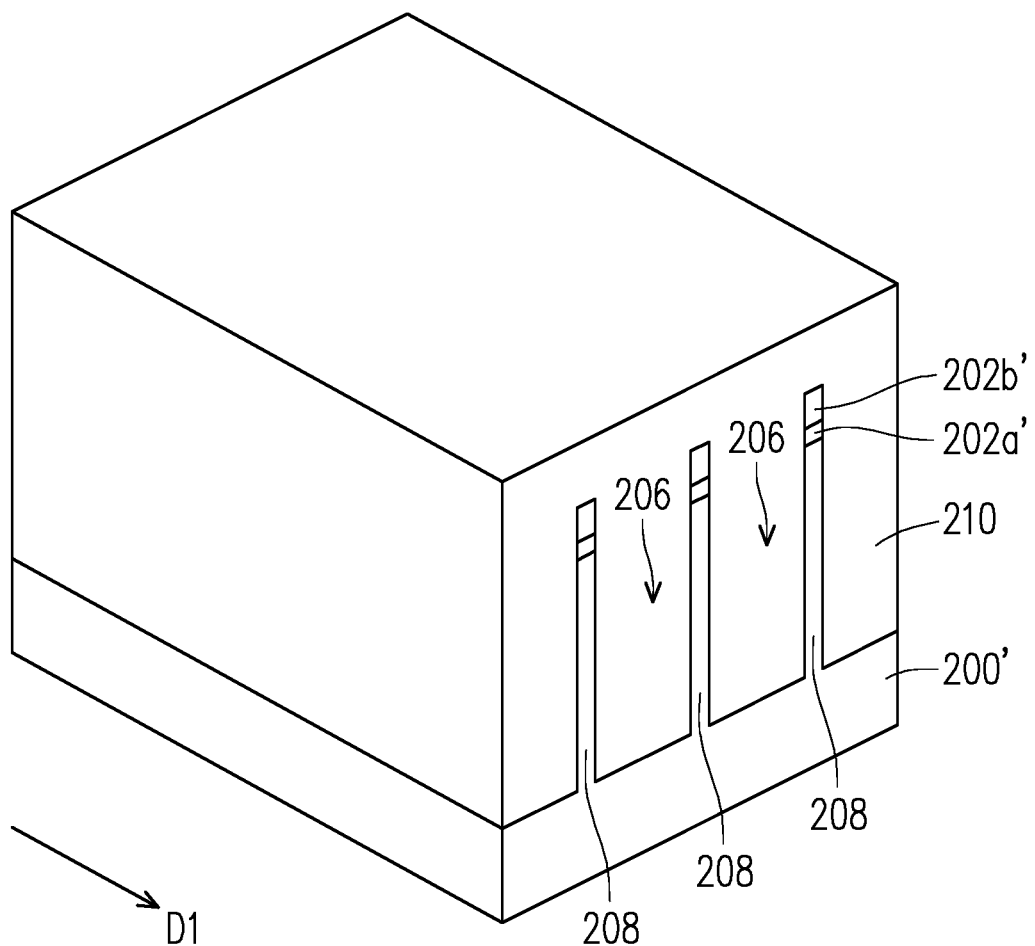

FIG. 1B is a perspective view illustrating one of various stages of a method of manufacturing a semiconductor device 10 in accordance with some embodiments of the disclosure.

Referring to FIG. 1B, portions of the mask layer 202b and the pad layer 202a not covered by the patterned photoresist layer 204 are sequentially etched to form a patterned mask layer 202b' and a patterned pad layer 202a'. The patterned mask layer 202b' and the patterned pad layer 202a' expose the underlying semiconductor substrate 200. By using the patterned mask layer 202b', the patterned pad layer 202a', and the patterned photoresist layer 204 as a mask, exposed portions of the semiconductor substrate 200 are etched to form a plurality of trenches 206 and define a plurality of fin structures 208 located between the trenches 206. In some embodiments, the semiconductor substrate 200 may be etched (or patterned) through an anisotropic etching process to form the trenches 206. For example, the semiconductor substrate 200 may be etched through a reactive ion etch (RIE), a neutral beam etch (NBE), the like, or a combination thereof. In some embodiments, the fins 208 are formed from the semiconductor substrate 200, and the fins 208 and the semiconductor substrate 200 are made of the same material. After the etching process, the patterned semiconductor substrate 200' is formed with the fin structures 208 upright-protruded there-from, and the fin structures are extending along a first direction D1 (as shown in FIG. 1B). Although FIG. 1B illustrated that the fin structures 208 have vertically straight profiles, the configuration merely serves as an exemplary illustration. In some embodiments, the semiconductor fin structures 208 may have non-straight profile(s). In other words, in some embodiments, the semiconductor fin structures 208 have slanted sidewalls or partially slanted sidewalls. In some embodiments, P wells (not shown) or N wells (not shown) may be formed in the semiconductor fin structures 208 or the semiconductor substrate 200'.

In some embodiments, widths (measured in a direction perpendicular to the extending direction D1) of the fin structures 208 may be smaller than 30 nm. In some embodiments, depths of the trenches 206 range from about 5 nm to about 500 nm. After the trenches 206 and the fin structures 208 are formed, the patterned photoresist layer 204 is removed. Thereafter, a cleaning process may be performed to remove native oxides of the semiconductor substrate 200' and the semiconductor fins 208. The cleaning process may be performed using diluted hydrofluoric (DHF) acid or other suitable cleaning solutions.

An insulating material 210 is formed over the semiconductor substrate 200'. In some embodiments, the insulating material 210 fills up the trenches 206 and covers the fin structures 208, the patterned pad layer 202a', and the patterned mask layer 202b'. The insulating material 210 may include silicon oxide, silicon nitride, silicon oxynitride, a spin-on dielectric material, or other dielectric materials. The insulating material 210 may be formed by High Density Plasma Chemical Vapor Deposition (HDPCVD), Sub Atmospheric Chemical Vapor Deposition (SACVD), spin-on, or other suitable processes.

Figure 1C:
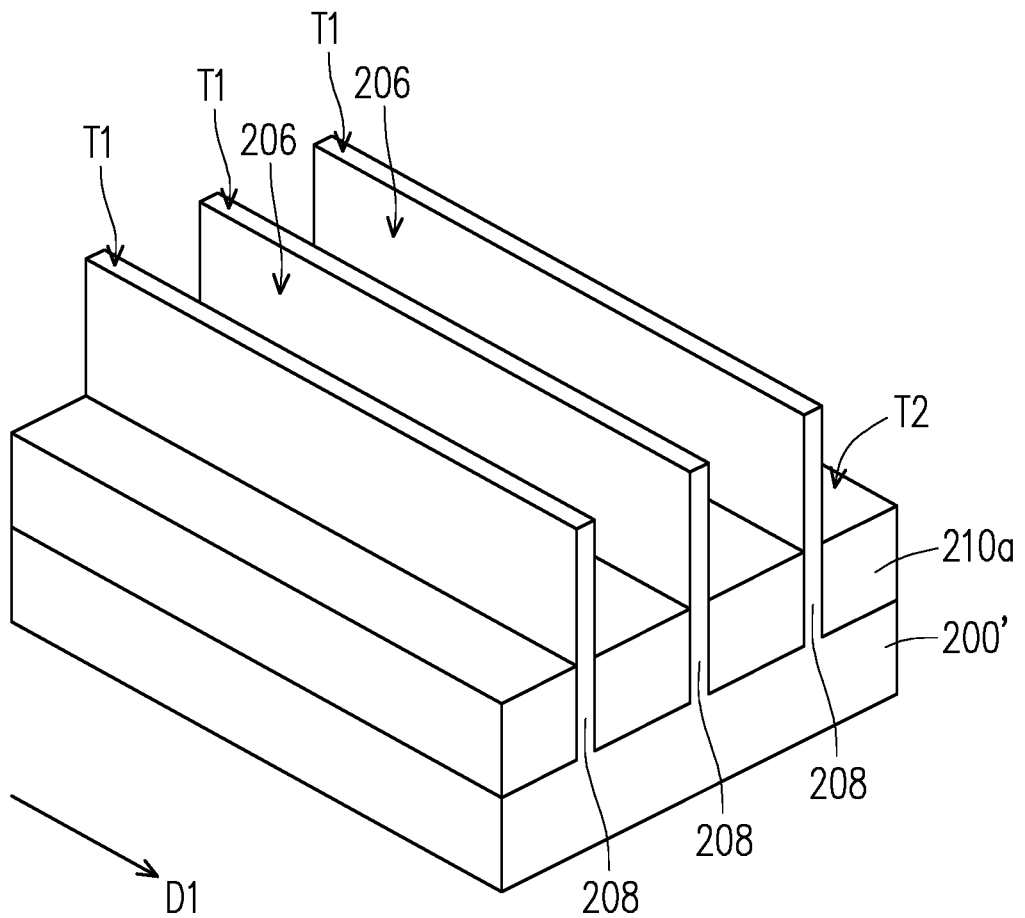

FIG. 1C is a perspective view illustrating one of various stages of a method of manufacturing a semiconductor device 10 in accordance with some embodiments of the disclosure.

Referring to FIG. 1C, a portion of the insulating material 210, the patterned pad layer 202a', and the patterned mask layer 202b' are removed. In some embodiment, a planarization process is performed to the insulating material 210. In some embodiments, after the insulating material 210 is planarized, a top surface of the polished insulating material 210 is substantially coplanar with a top surface of the patterned mask layer 202b'. The planarization process includes, for example, a chemical mechanical polish (CMP) process, an etch back process, combinations thereof, or the like. In some embodiments, after the insulating material 210 is planarized, the top surfaces of the semiconductor fins 208 are protected by the patterned pad layer 202a' and the patterned mask layer 202b' and are not revealed. The polished insulating material 210 filled in the trenches 206 is partially removed by an etching process to form a plurality of insulators 210a in the trenches 206, wherein a portion of each of the fin structures 208 protrudes from the insulators 210. In some embodiments, the polished insulating material 210 may be etched off by a wet etching process with hydrofluoric acid (HF). Alternatively, the polished insulating material 210' may be etched off by a dry etching process with $HF_3$ and $NH_3$ gases. During the dry etching process, plasma may be generated and Argon may also be included. As illustrated in FIG. 1C, each fin structure 208 is sandwiched between two adjacent insulators 210a. In some embodiments, top surfaces T2 of the insulators 210a are lower than top surfaces T1 of the semiconductor fins 208. As shown in FIG. 1C, after the formation of the insulators 210a, the fin structures 208 are protruded from the insulators 210a, and the protruded height of the fin structures 208 protruding from the top surfaces T2 of the insulators 210a is considered the effective height of the fin structure 208 (i.e. fin height). In some embodiments, the insulators 210a may be referred to as shallow trench isolation (STI). In some embodiments, the top surfaces T2 of the insulators 210a may be a substantially flat surface (as shown in FIG. 1C). Alternatively, the top surface T2 of the insulators 210a may be a convex surface, a concave surface, or a combination thereof.

Figure 1D:
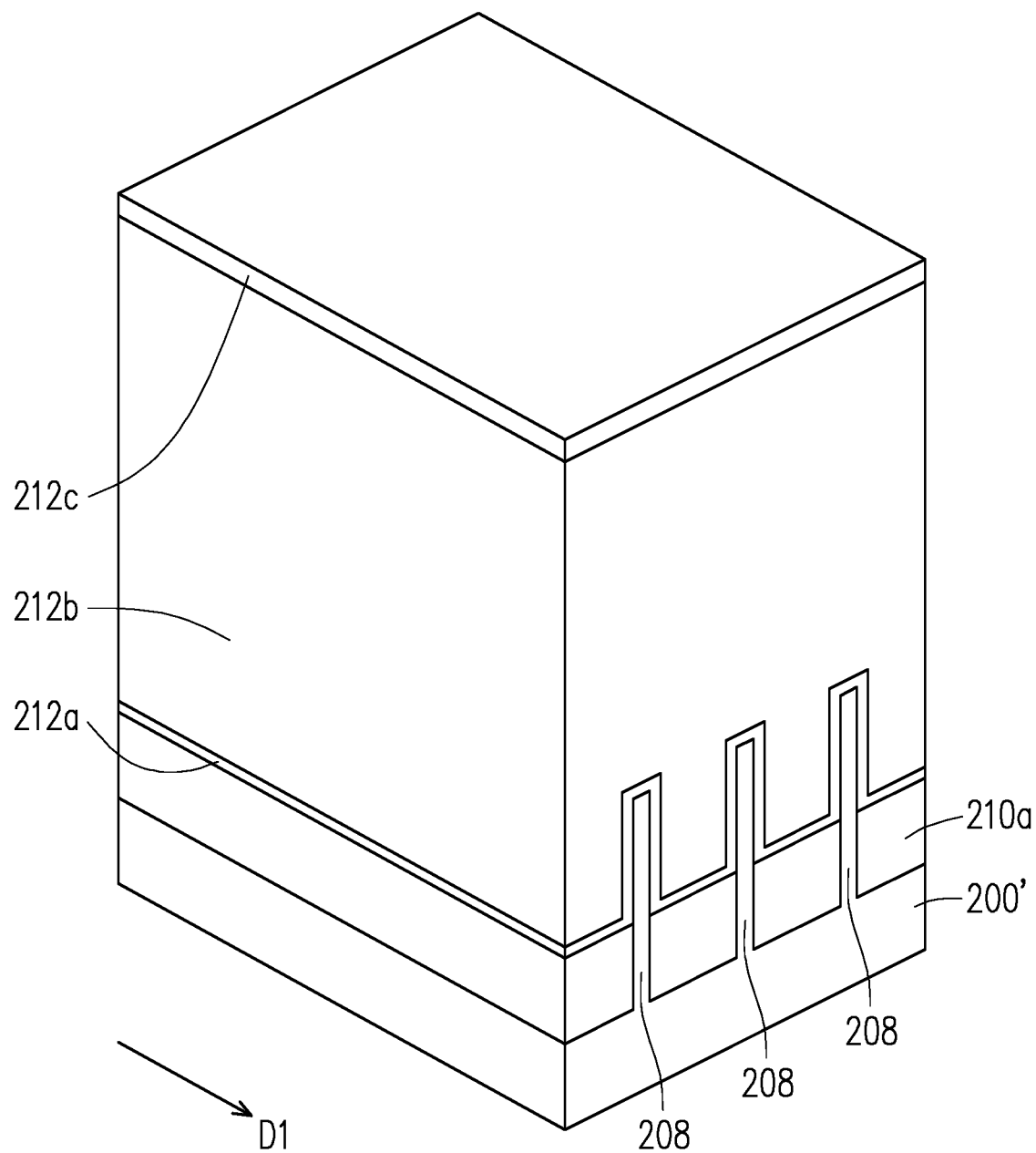

FIG. 1D is a perspective view illustrating one of various stages of a method of manufacturing a semiconductor device 10 in accordance with some embodiments of the disclosure.

Referring to FIG. 1D, a dielectric layer 212a is formed over the fin structures 208 and the insulators 210a. In some embodiments, the dielectric material 212a is conformally formed over the insulators 210a and the semiconductor fin structures 208. In some embodiments, the dielectric layer 212a may include silicon oxide, silicon nitride, or silicon oxynitride. The dielectric layer 212a may be formed using a suitable process, such as atomic layer deposition (ALD), chemical vapor deposition (CVD), physical vapor deposition (PVD), thermal oxidation, UV-ozone oxidation, or a combination thereof. In some embodiments, a thickness of the dielectric layer 212a ranges between 1 nm and 30 nm.

Referring to FIG. 1D, a material 212b is formed on the dielectric layer 212a. In some embodiments, the material 212b may be a single-layered structure or a multi-layered structure. In some embodiments, the material 212b includes a silicon-containing material, such as polysilicon, amorphous silicon, or a combination thereof. In some embodiments, a thickness of the material 212b ranges between 5 nm and 50 nm. The material 212b may be formed by a suitable process, such as ALD, CVD, PVD, or a combination thereof.

Referring to FIG. 1D, a mask material 212c is formed on the material 212b. In some embodiments, the mask material 212c includes silicon nitride, silicon oxide, silicon carbonitride (SiCN), or combinations thereof.

Figure 1E:
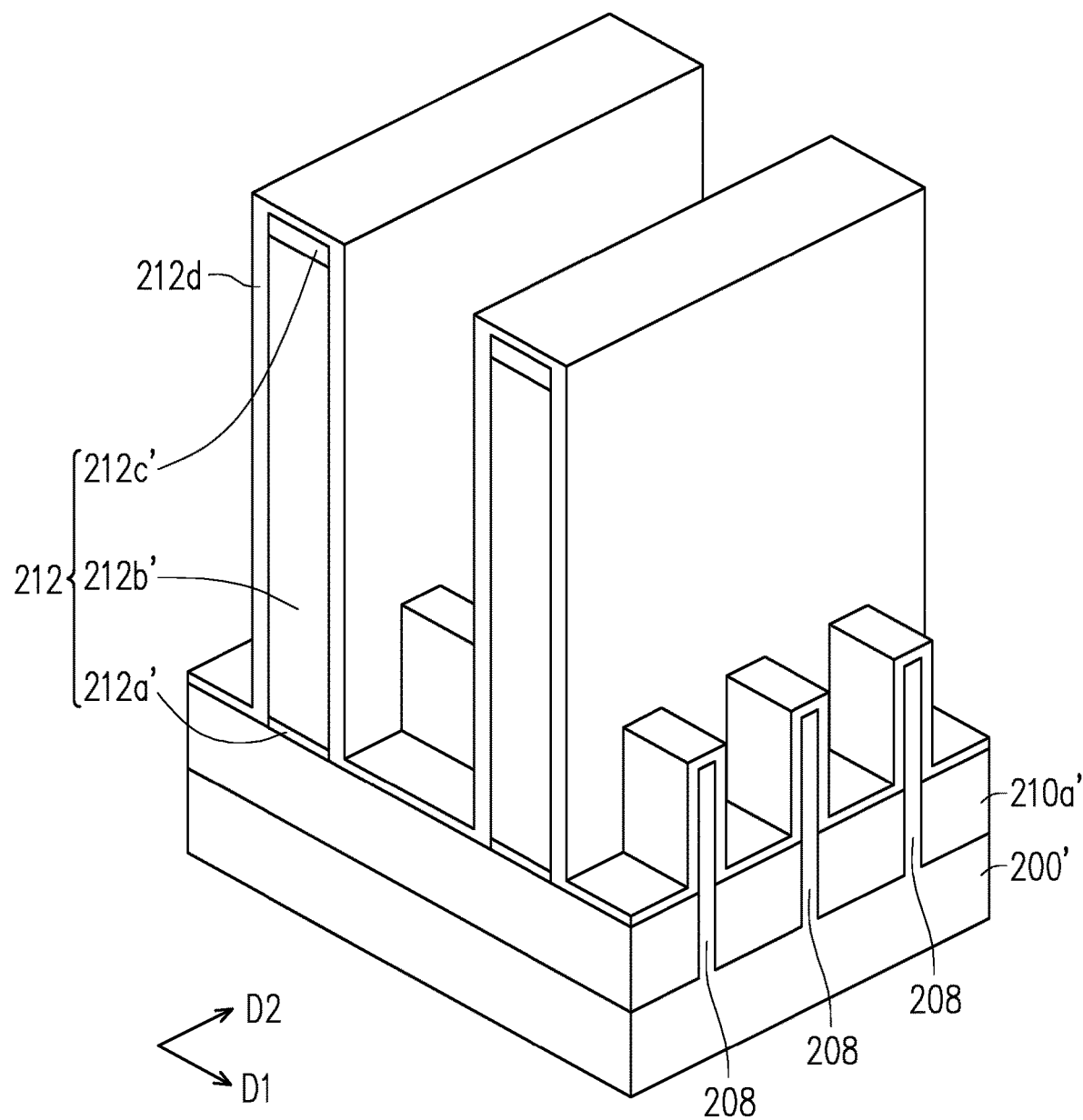

FIG. 1E is a perspective view illustrating one of various stages of a method of manufacturing a semiconductor device 10 in accordance with some embodiments of the disclosure.

Referring to FIG. 1E, the dielectric layer 212a, the electrode material 212b, and the mask layer 212c are patterned into stack structures 212 across the fin structures 208. In some embodiments, the dielectric layer 212a, the electrode material 212b, and the mask layer 212c are patterned by using a mask pattern (not shown) and performing an anisotropic etching process. In some embodiments, in FIG. 1E, the stack structures 212 are strip-shaped and arranged in parallel, and the extending direction D2 of the strip-shaped stack structures is perpendicular to the extending direction D1 of the fin structures 208. The stack structure 212 includes a dummy gate insulation layer 212a', a dummy gate electrode 212b' located on the dummy gate insulation layer 212a' and a mask layer 212c' located on the dummy gate electrode 212b'. The dummy gate insulation layer 212a' is located between the dummy gate electrode 212b' and the semiconductor substrate 200'. The dummy gate insulation layer 212a' is sandwiched between the fin structures 208 and the dummy gate electrode 212b' and functions as an etching stop layer or a buffer layer to protect the underlying channel regions of the fin structures 208.

Referring to FIG. 1E, a spacer material 212d is formed over the stack structures 212 (the mask layer 212c', the dummy gate electrode 212b', the dummy gate insulation layer 212a'), the insulators 210a, and the fin structures 208. In some embodiments, the spacer material 212d is formed of dielectric materials, such as silicon oxide, silicon nitride, SiCN, silicon carbon oxynitride (SiCON), or a combination thereof. In some embodiments, the spacer material 212d may be formed by thermal oxidation, CVD, PVD or other suitable process. In some embodiments, a thickness of the spacer material 212d ranges between 1 nm and 10 nm. It should be noted that the spacer material 212d may be formed as a single layer or a stack of multi-layers.

Figure 1F:
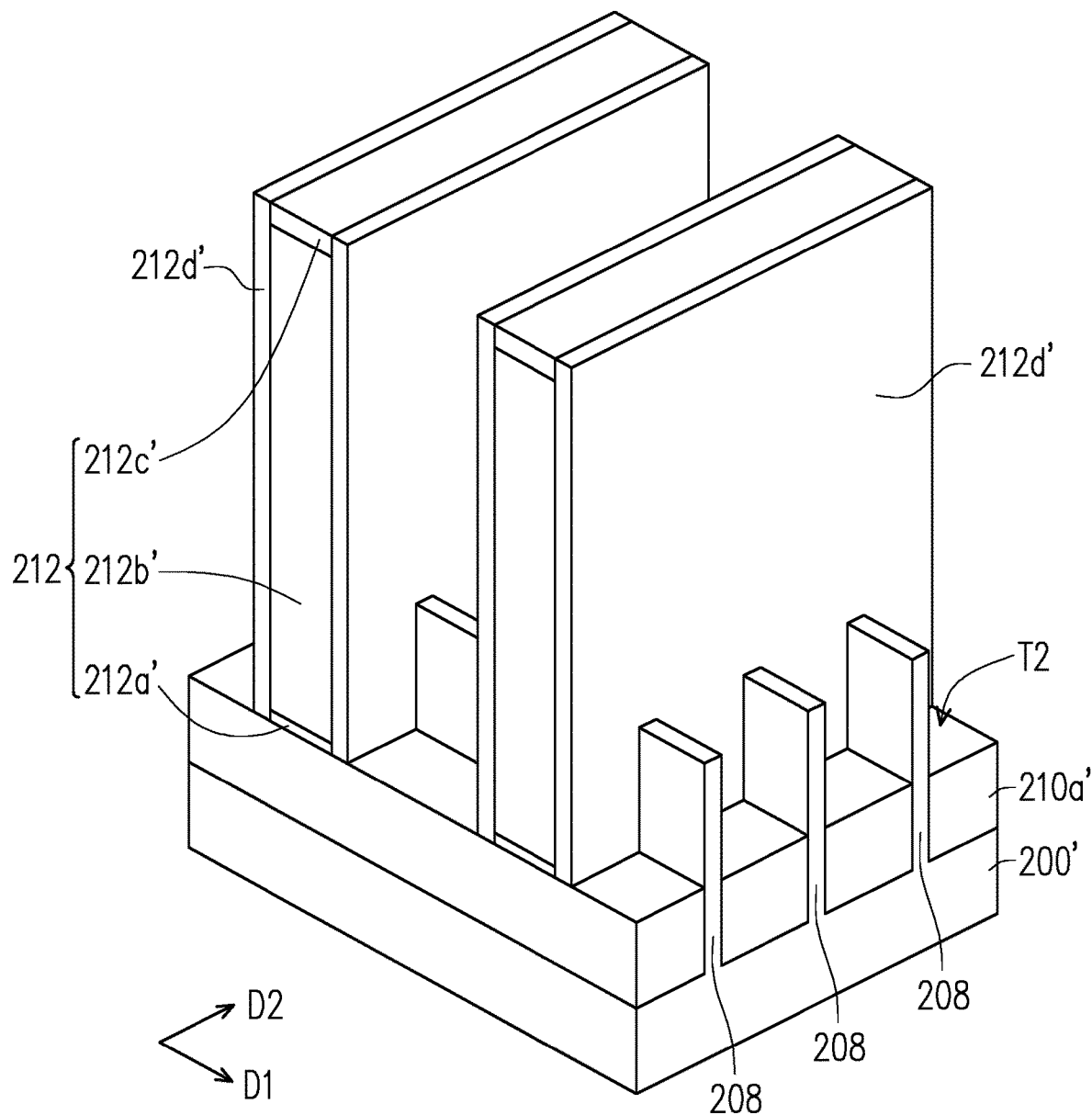

FIG. 1F is a perspective view illustrating one of various stages of a method of manufacturing a semiconductor device 10 in accordance with some embodiments of the disclosure.

Referring to FIG. 1F, the spacer material 212d is selectively etched to form spacers 212d' located on sidewalls of the stack structures 212. The spacers 212d' are disposed on two opposite sidewalls of the stack structures 212 (sidewalls of the mask layer 212c', the dummy gate electrode 212b', and the dummy gate insulation layer 212a'). In some embodiment, the spacer material 212d is selectively etched by performing an angled anisotropic etch process. In FIG. 1F, the spacers 212d' are shown with a uniform thickness and include vertically flat side surfaces. However, the disclosure is not limited by the drawings. In some embodiment, sidewalls of the spacers 212d' include curve surfaces. It should be noted that each of the spacers 212d' may be a single-layered structure or a multi-layered structure.

Figure 1G:
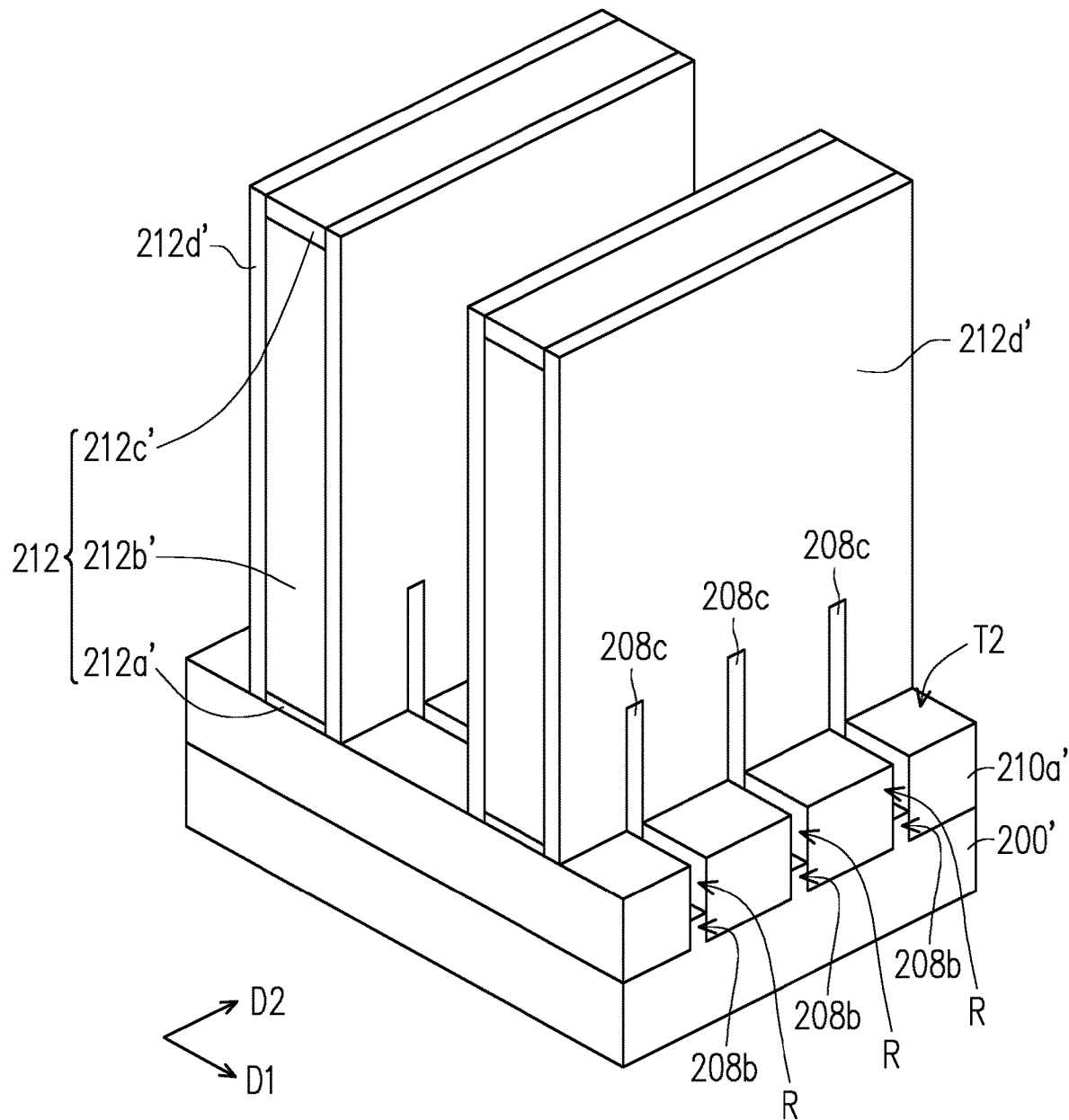

FIG. 1G is a perspective view illustrating one of various stages of a method of manufacturing a semiconductor device 10 in accordance with some embodiments of the disclosure.

Referring to FIG. 1G, the fin structures 208 that are not covers by the stack structures 212 and the spacers 212d' are removed/recessed below the top surfaces T2 of the insulators 210a to form a plurality of recessed portions R. The recessed portions R in the fin structures 208 may be formed by performing, for example, an anisotropic etching process, an isotropic etching process, or a combination thereof. In some embodiments, the recessed portions R in the fin structures 208 are recessed to have bottom surfaces below the top surfaces T2 of the insulators 210a. In some embodiments, a depth of the recessed portions R is less than a thickness of the insulators 210a. That is, the bottom surfaces of the recessed portions R are higher than the bottom surfaces of the insulators 210a. In other words, the fin structures 208 exposed by the stack structures 212 and the spacers 212d' are not entirely removed, and the remaining fin structures 208b located below the recessed portion R later form parts of source/drain regions. The fin structures 208 that are covered by the stack structures 212 and the spacers 212d' may be referred to as the channel portions 208c of the fin structures 208. As illustrated in FIG. 1G, the fin structures 208 that are covered by the stack structures 212 and the spacers 212d' (i.e. channel portions 208c) are not etched and are revealed from the sidewalls of the spacers 212d'.

Figure 1H:
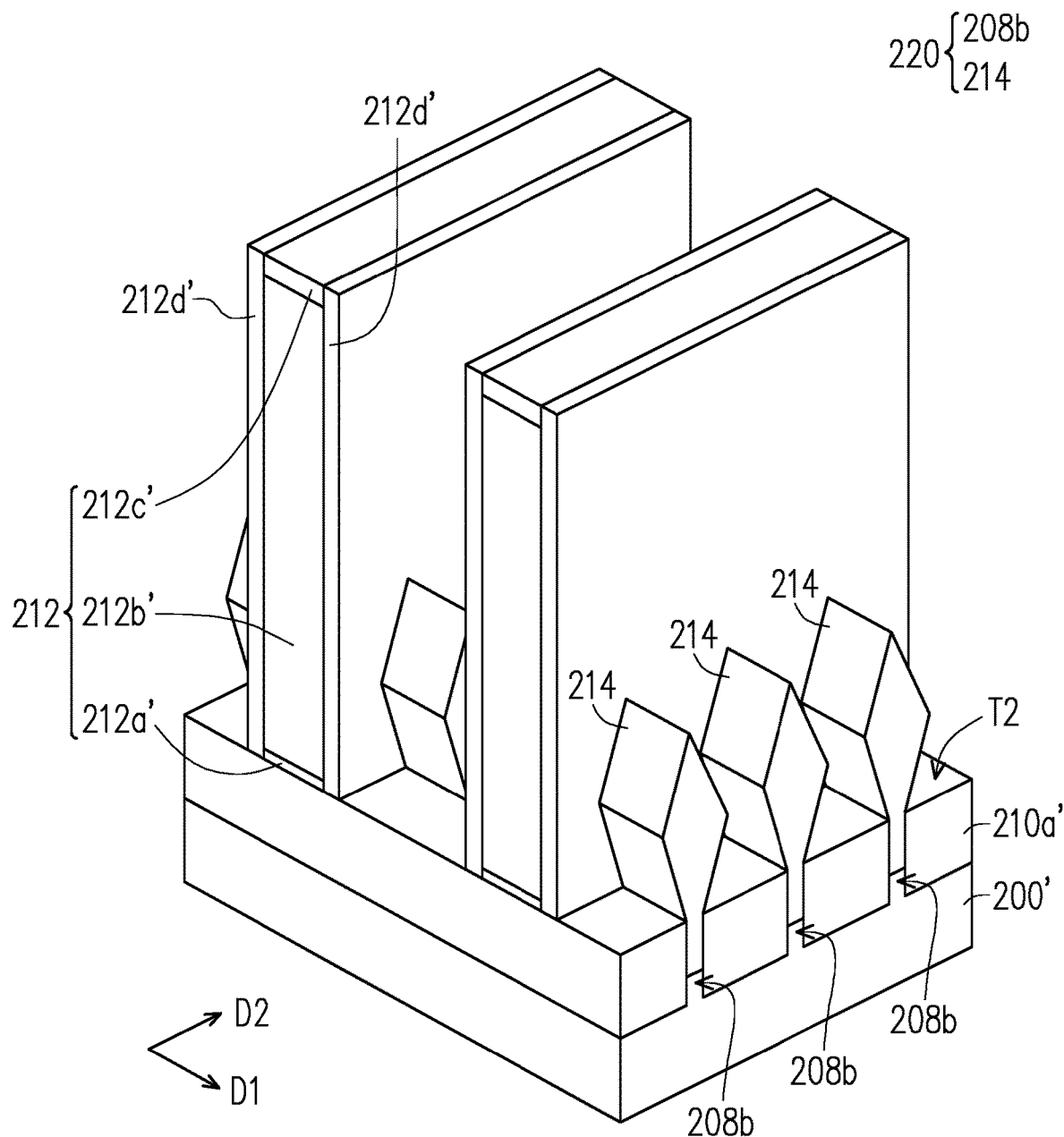

FIG. 1H is a perspective view illustrating one of various stages of a method of manufacturing a semiconductor device 10 in accordance with some embodiments of the disclosure.

Referring to FIG. 1H, strained material structures 214 (or highly-doped low-resistance material structures) are grown on the recessed portions R and extends upward and beyond the top surfaces T2 of the insulators 210a. That is, the strained material structures 214 are formed on the recessed portions R and cover the portions 208c of the fin structures 208 that are revealed from the sidewalls of the spacers 212d'. In some embodiments, the strained material structures 214 are epitaxially grown to have protruded shapes or diamond shapes. In some embodiments, the strained material structures 214 are formed of high-quality strained material through epitaxial growth technology, such as cyclic deposition-etch (CDE) epitaxy or selective epitaxial growth (SEG). In some embodiments, a material of the strained material structures 214 is different than a material of the fin structures 208. Since the strained material has a lattice constant different from that of the fin structures 208, the channel region(s) 208c sandwiched between the strained material structures 214 is strained or stressed to increase carrier mobility of the device and enhance the device performance. In some embodiments, the strained material structures 214 and the remaining fin structures 208b located below form the source/drain regions 220 of the subsequently formed device.

In some embodiments, the strained material structures 214 are formed such that each dummy gate electrode 212b' is disposed between respective neighboring pairs of the strained material structures 214. As illustrated in FIG. 1H, the dummy gate electrode 212b' are separated from the neighboring strained material structures 214 by the corresponding spacers 212d'. As such, appropriate lateral distance is maintained between the dummy gate electrode 212b' and the strained material structures 214, so the strained material structures 214 do not short out with the subsequently formed gates of the resulting device.

In some embodiments, the strained material structures 214 may be doped with a conductive dopant. In some embodiments, the strained material structures 214, such as SiGe, SiGeB, Ge, GeSn, or the like, are epitaxial-grown with p-type dopants for straining a p-type FinFET. That is, the strained material structures 214 are doped with the p-type dopants to be the source and the drain of the p-type FinFET. The p-type dopants include boron or $BF_2$. In some alternative embodiments, the strained material structures 214, such as SiC, SiP, SiCP, a combination of SiC/SiP, or the like, are epitaxial-grown with n-type dopants for straining an n-type FinFET. That is, the strained material structures 214 are doped with the n-type dopants to be the source and the drain of the n-type FinFET. The n-type dopants include arsenic and/or phosphorus. In some embodiments, the strained material structures 214 may be epitaxial-grown by LPCVD process with in-situ doping. Depending on the type of the device, the strained material structures 214 in different regions may be doped with different type of dopants. Similarly, depending on the function of the device, the strained material structures 214 in different regions may be doped with different dopant concentrations. In some embodiments, each of the strained material structures 214 may be a single-layered structure or a multi-layered structure.

As mentioned above, the strained material structures 214 may include SiGe, SiGeB, Ge, GeSn, SiC, SiP, SiCP, a combination of SiC/SiP, or the like. However, the disclosure is not limited thereto. In some alternative embodiments, the strained material structures 214 may also include III-V compound semiconductors, such as GaAs, InP, GaN, InGaAs, InAlAs, GaSb, AlSb, AlAs, AlP, GaP, or a combination thereof. As illustrated in FIG. 1G to FIG. 1H, after the strained material structures 214 are grown to reach the top surfaces T2 of the insulators 210a, the epitaxial growth of the strained material structures 214 continues. In some embodiments, the strained material structures 214 above the top surfaces T2 of the insulators 210a expand horizontally and facets are formed for each of the strained material structure 214. As shown in FIG. 1H, the strained material structures 214 are separated from each other. However, the disclosure is not limited thereto. In some alternative embodiments, the further growth of the strained material structures 214 above the top surfaces T2 of the insulators 210a may cause neighboring strained material structures 214 to merge with each other.

It should be noted that the recess step illustrated in FIG. 1G may be omitted in some embodiments. For example, the strained material structures 214 may be formed on the un-recessed fin structures 208 not covered by the stack structures 212 and the spacers 212d'.

Figure 1I:
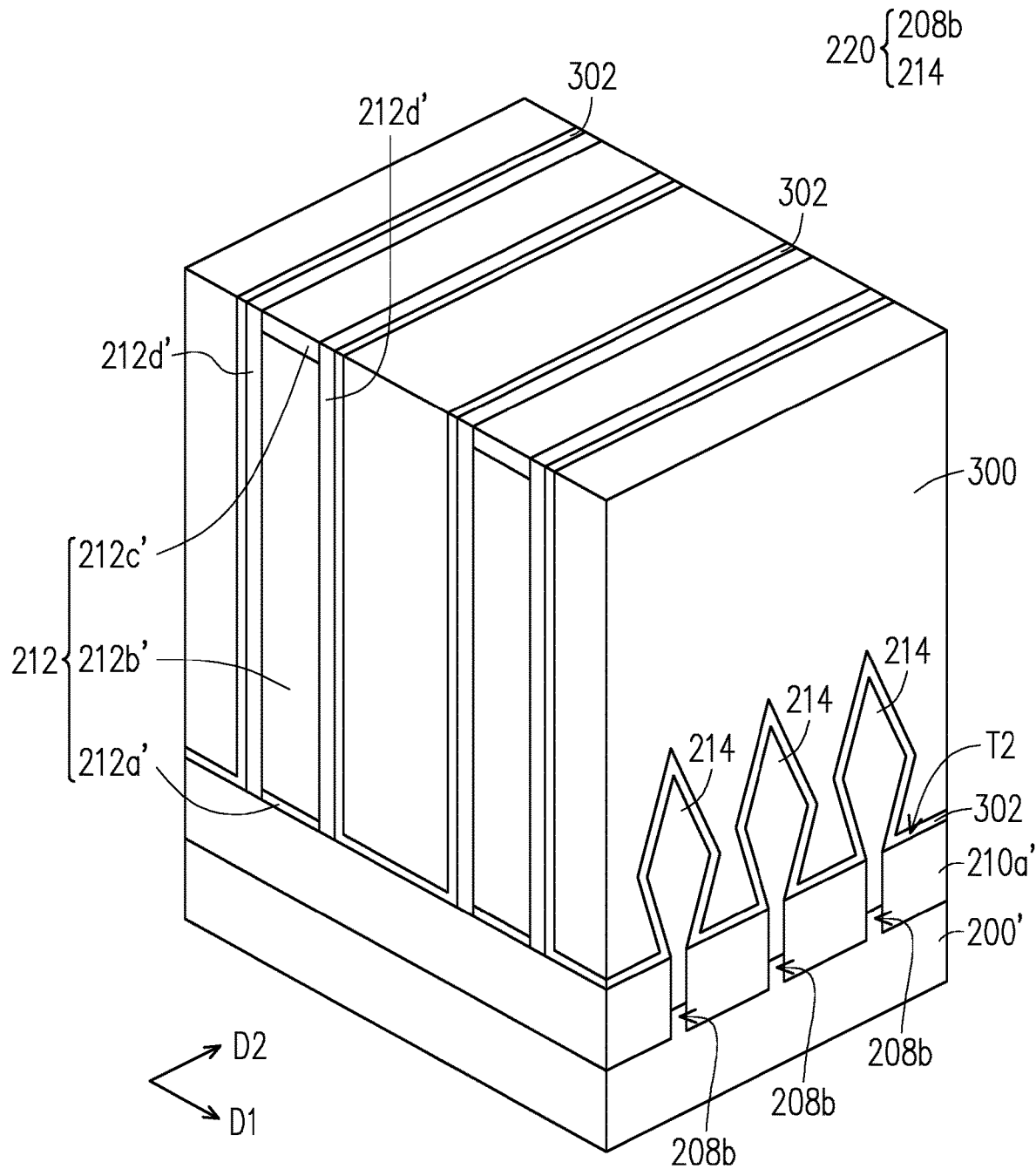

FIG. 1I is a perspective view illustrating one of various stages of a method of manufacturing a semiconductor device 10 in accordance with some embodiments of the disclosure.

Referring to FIG. 1I, an etch stop layer 302 and an interlayer dielectric layer 300 are sequentially formed over the strained material structures 214 and the insulators 210a. In some embodiments, the etch stop layer 302 is disposed on the spacers 212d', the insulators 210a, and the strained material structures 214. The etch stop layer 302 is conformally formed on the top surfaces T2 of the insulators 210a and the strained material structures 214. In some embodiments, the etch stop layer 302 may be formed of silicon oxide, silicon nitride, silicon carbo-nitride, SiOCN, or the like. In some embodiments, the etch stop layer 302 may be formed through, for example, CVD, SACVD, Molecular Layer Deposition (MLD), ALD, or the like. In some embodiments, the etch stop layer 320 may be referred to as "contact etch stop layer (CESL)."

As illustrated in FIG. 1I, the interlayer dielectric layer 300 is formed on the etch stop layer 302 and disposed beside the spacers 212d'. In some embodiments, the interlayer dielectric layer 300 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. It is understood that the interlayer dielectric layer 300 may include one or more dielectric materials and/or one or more dielectric layers. In some embodiments, the interlayer dielectric layer 300 is formed to a suitable thickness by Flowable Chemical Vapor Deposition (FCVD), CVD, HDPCVD, SACVD, spin-on, sputtering, or other suitable methods.

Figure 1J:
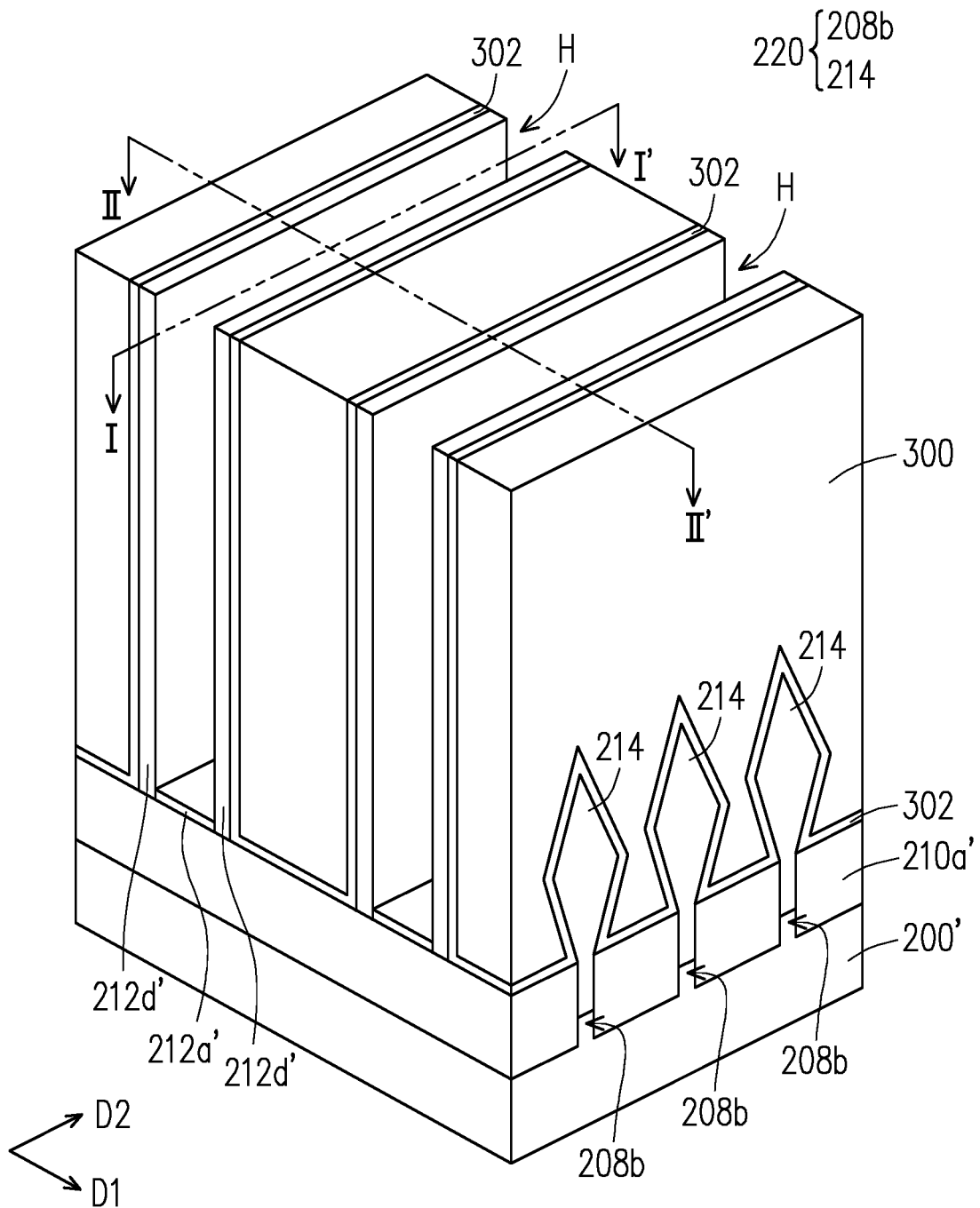

FIG. 1J is a perspective view illustrating one of various stages of a method of manufacturing a semiconductor device 10 in accordance with some embodiments of the disclosure.

Referring to FIG. 1J, the dummy gate electrode 212b' and the mask layer 212c' are removed to form a hollow portion H between two adjacent spacers 212d'. In the present embodiment, the dummy gate insulation layer 212a' is located below the hollow portion H.

Figure 2A:
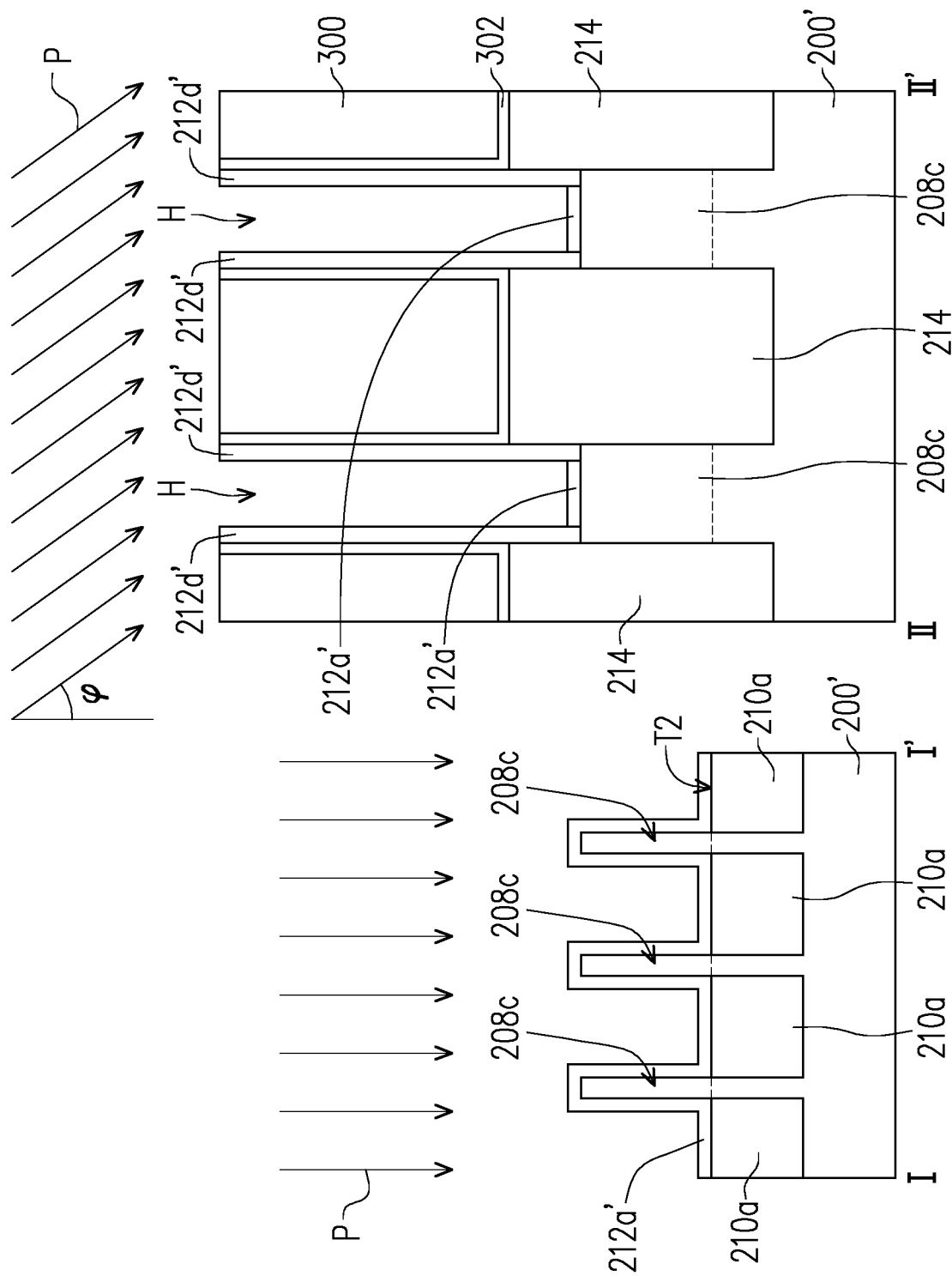
FIG. 2A is a cross-sectional view of a first step of an ion implantation process taken along line I-I' and line II-IF of FIG. 1J.
Figure 2B:
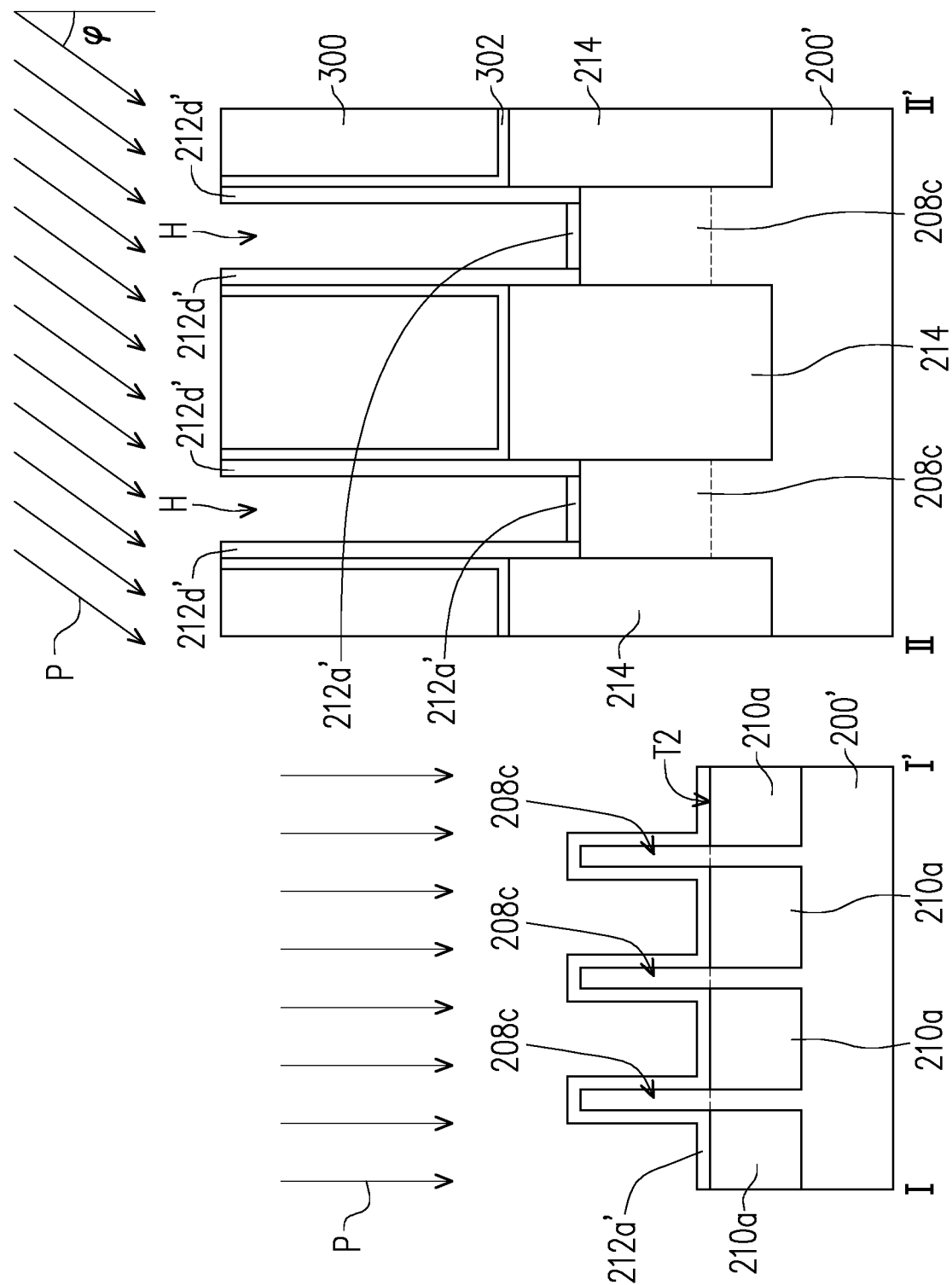
FIG. 2B is a cross-sectional view of a second step of the ion implantation process taken along line I-I' and line II-IF of FIG. 1J.

FIG. 2A is a cross-sectional view of a first step of an ion implantation process taken along line I-I' and line II-IF of FIG. 1J. FIG. 2B is a cross-sectional view of a second step of the ion implantation process taken along line I-I' and line II-IF of FIG. 1J.

Referring to FIG. 2A and FIG. 2B, after removing the dummy gate electrode 212b' and the mask layer 212c', an ion implantation process P is performed on the spacers 212d' to reduce the dielectric constant of the spacers 212d'. In some embodiments, the ion implantation process P is performed on the spacers 212d' and the dummy gate insulation layer 212a'. The dummy gate insulation layer 212a' below the hollow portion H can prevent the insulators 210a and the semiconductor substrate 200' from being damaged during the ion implantation process P. That is, the channel portions 208c of the fin structures 208 may not be damaged by the ion implantation process P.

In this embodiment, ion implantation process P may be performed with the tilt angle φ and the twist angle θ. The definition of the tilt angle φ and twist angle θ can be referred to FIG. 4 and its related description. In some embodiment, the ion implantation process P may include multiple steps with different tilt angle φ and/or twist angle θ, such that the uniformity of dopant in the spacers 212d' may be improved.

In this embodiment, the ion implantation process P includes a first step (FIG. 2A) and a second step (FIG. 2B). The tilt angle φ of the first step and the second step are the same. The twist angle θ of the first step is 180 degrees different from the twist angle θ of the second step. Therefore, the uniformity of doping concentration of the spacers 212d' on opposite sidewalls of the hollow portion H may be improved. In this embodiments, the wafer including the semiconductor substrate 200' (or the ion beam) was rotated to perform ion implantation process P with different twist angles θ.

In some embodiments, molecular ions are used in the ion implantation process P. Each of the molecular ions includes more than one (at least two) of fluorine atoms. For example, the molecular ions including at least one of $GeF_2^+$, $CF_3^+$, $NF_3+$, and $SiF_3+$. In some embodiment, at least a portion of bonding between the fluorine ions and cations in the molecular ions are broken after the molecular ions hitting the spacers 212d', and at least a portion of fluorine ions decomposed from the molecule ions are incorporated into the spacers 212d'. In some embodiment, cations of the molecular ions are left on the surface of the spacers 212d'.

In order to obtain the same doping concentration, compare with monomer fluorine ions, the molecular ions including two or more fluorine (atoms) can be implanted with a higher implant energy and a lower dose. With the higher implant energy and lower dose, the process window for controlling the ion beam for the ion implantation process P can be enlarged. That is, the depth and concentration of fluorine (i.e. doping profile) in the spacers 212d' after the ion implantation process P can be precisely controlled. With the same doping conditions, the doping depth of the doped fluorine ion from the ion implantation process using the molecular ions is shallower than the doping depth of the doped fluorine ion from the ion implantation process using the monomer ions. It is because the molecular ions are larger either in size or in molecular weight than the monomer ions (i.e. the molecular ions are heavier). Therefore, the spacers can be precisely doped with shallow or ultra-shallow junction or profile by using the molecular ions as dopants.

In some embodiment, the spacers 212d' is heated so as to reduce the damage cause by the ion implantation process P. In some embodiment, the spacers 212d' is heated under 100° C. to 500° C. while performing the ion implantation process P. In some embodiment, the spacers 212d' is heated under 100° C. to 500° C. after performing the ion implantation process P.

Figure 1K:
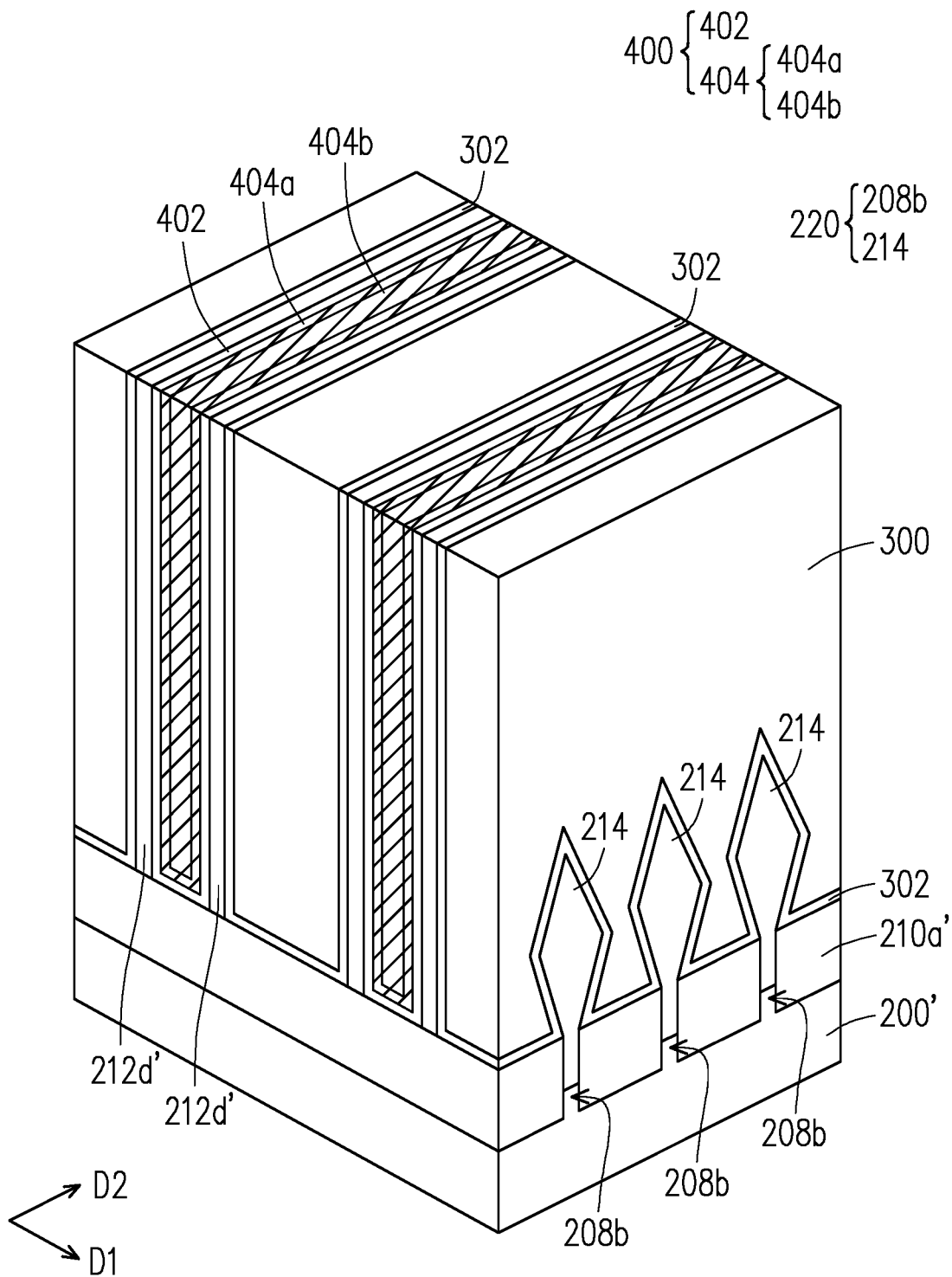

FIG. 1K is a perspective view illustrating one of various stages of a method of manufacturing a semiconductor device 10 in accordance with some embodiments of the disclosure.

Referring to FIG. 1K, the dummy gate insulation layer 212a' is removed after the ion implantation process P. The gate structures 400 are disposed across the fin structures 208. For example, the gate structures 400 are disposed over the channel regions of the semiconductor fin structures 208. The gate structures 400 includes a gate insulation layer 402 and a gate electrode 404.

In some embodiments, the gate insulation layer 402 is conformally deposited into the hallow portion H between the spacers 212d'. In some embodiments, a material of the gate insulation layer 402 may be identical to or different from the material of the dummy gate insulation layer 212a'. For example, the gate insulation layer 402 includes silicon oxide, silicon nitride, silicon oxynitride, or a combination thereof. In some alternative embodiments, the gate insulation layers 402 are made of a high-k dielectric material. In some embodiments, the high-k dielectric material refers to dielectric materials having a dielectric constant greater than about 7.0, and may include a metal oxide or a silicate of Hf, Al, Zr, La, Mg, Ba, Ti, Pb, and combinations thereof.

The gate electrodes 404 is formed on the gate insulation layer 402. The gate insulation layer 402 is disposed between the semiconductor substrate 200' and the gate electrode 404. In some embodiments, the gate electrodes 404 includes a work function layer 404a and a metal layer 404b. The work function layer 404a is conformally disposed on the gate insulation layer 402. The metal layer 404b is disposed on the work function layer 404a. In some embodiments, the metal layer 404b may include tungsten, cobalt, or the like. In some embodiments, precursor gases for forming the tungsten metal layer 404b may include tungsten hexafluoride ($WF_6$), silane ($SiH_4$), and/or hydrogen ($H_2$). In some embodiments, the metal layer 404b is formed through CVD. In some embodiments, a barrier layer (not shown) may exist between the metal layer 404b and the work function layer 404a. The barrier layer includes, for example, TiN or the like and is formed through ALD.

During the formation of the gate insulation layer 402, the work function layer 404a, and the metal layer 404b, excessive portions of these layers may be formed outside of the hollow portion H. For example, excessive portions of these layers are formed on the etch stop layer 302 and the interlayer dielectric layer 300. As such, a planarization process, such as a CMP process, may be performed to remove excessive portions of these layers to render the structure illustrated in FIG. 1K. As illustrated in FIG. 1K, the gate insulation layer 402 and the work function layer 404a have U-shaped cross-sectional views.

Figure 1L:
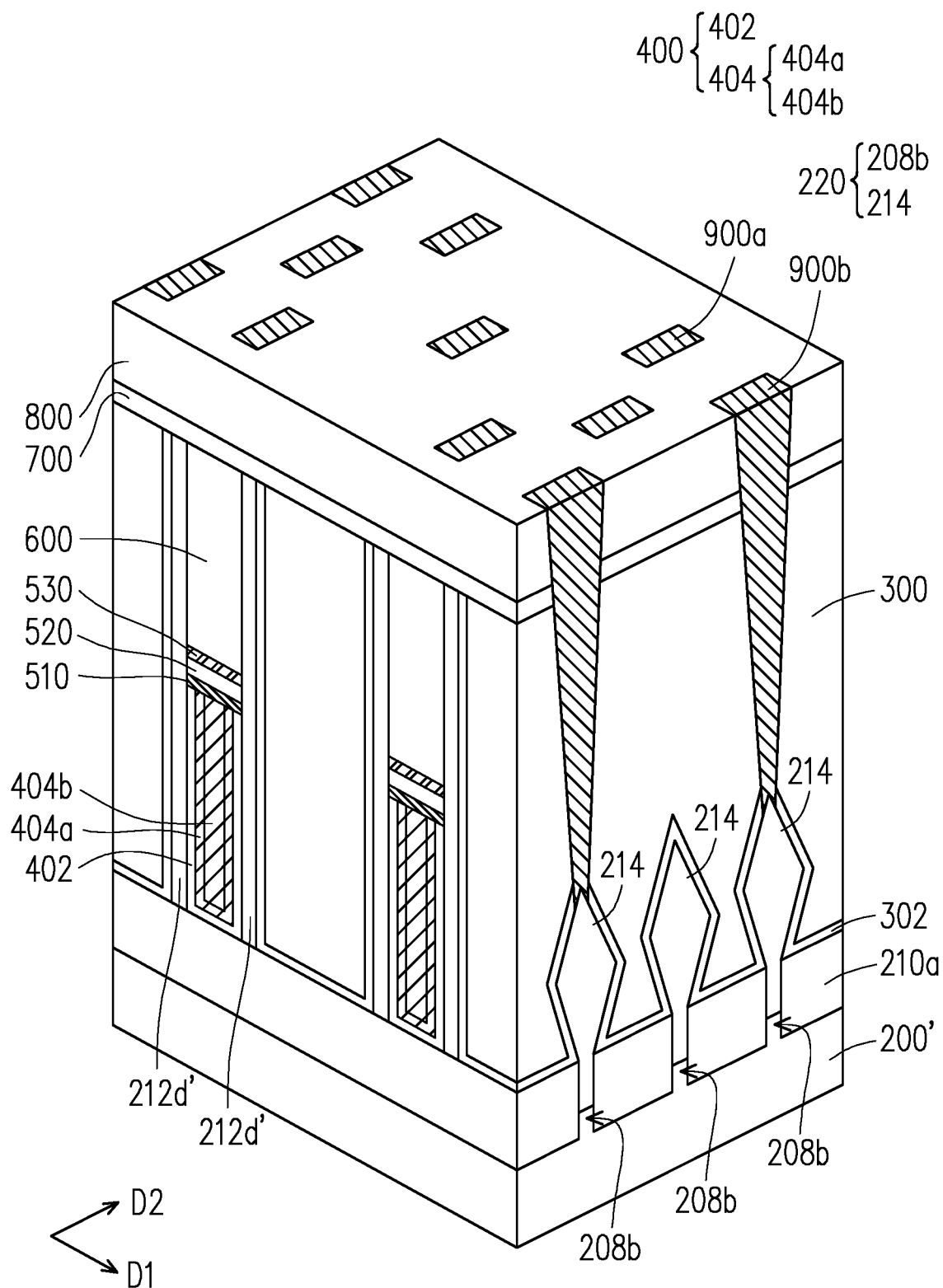

FIG. 1L is a perspective view illustrating one of various stages of a method of manufacturing a semiconductor device 10 in accordance with some embodiments of the disclosure.

Referring to FIG. 1L, portions of the gate structures 400 may be removed through an etch back process. For example, a portion of the gate dielectric layer 402, a portion of the work function layer 404a, and a portion of the metal layer 404b may be removed through performing a wet etching process or a dry etching process.

A metal layer 510, a ferroelectric layer 520, a metal layer 530, and a hard mask layer 600 are disposed on the gate structures 400 between the spacer 212d'. An etch stop layer 700 and an interlayer dielectric layer 800 are sequentially formed over the interlayer dielectric layer 300, the etch stop layer 302, the spacers 212d', and the hard mask layer 600.

In some embodiments, the conductive contacts 900 may be formed by, for example, electro-chemical plating process, CVD, PECVD, ALD, PVD, a combination thereof, or the like. In some embodiments, the conductive contacts 900 includes a plurality of first conductive contacts 900a and a plurality of second conductive contacts 900b. The first conductive contacts 900a are electrically connected to the metal layer 530 and the gate structures 400. On the other hand, the second conductive contacts 900b are electrically connected to the strained material structures 214. In other words, the first conductive contacts 900a may be referred to as "gate contacts" while the second conductive contacts 900b may be referred to as "source/drain contacts."

Base on the above, the spacers of semiconductor device are treated by the ion implantation process with the molecular ions. Therefore, the process control window for ion beam of the ion implantation process can be enlarged, and the depth and concentration of fluorine in the spacers after the ion implantation process can be precisely controlled.

Figure 3:
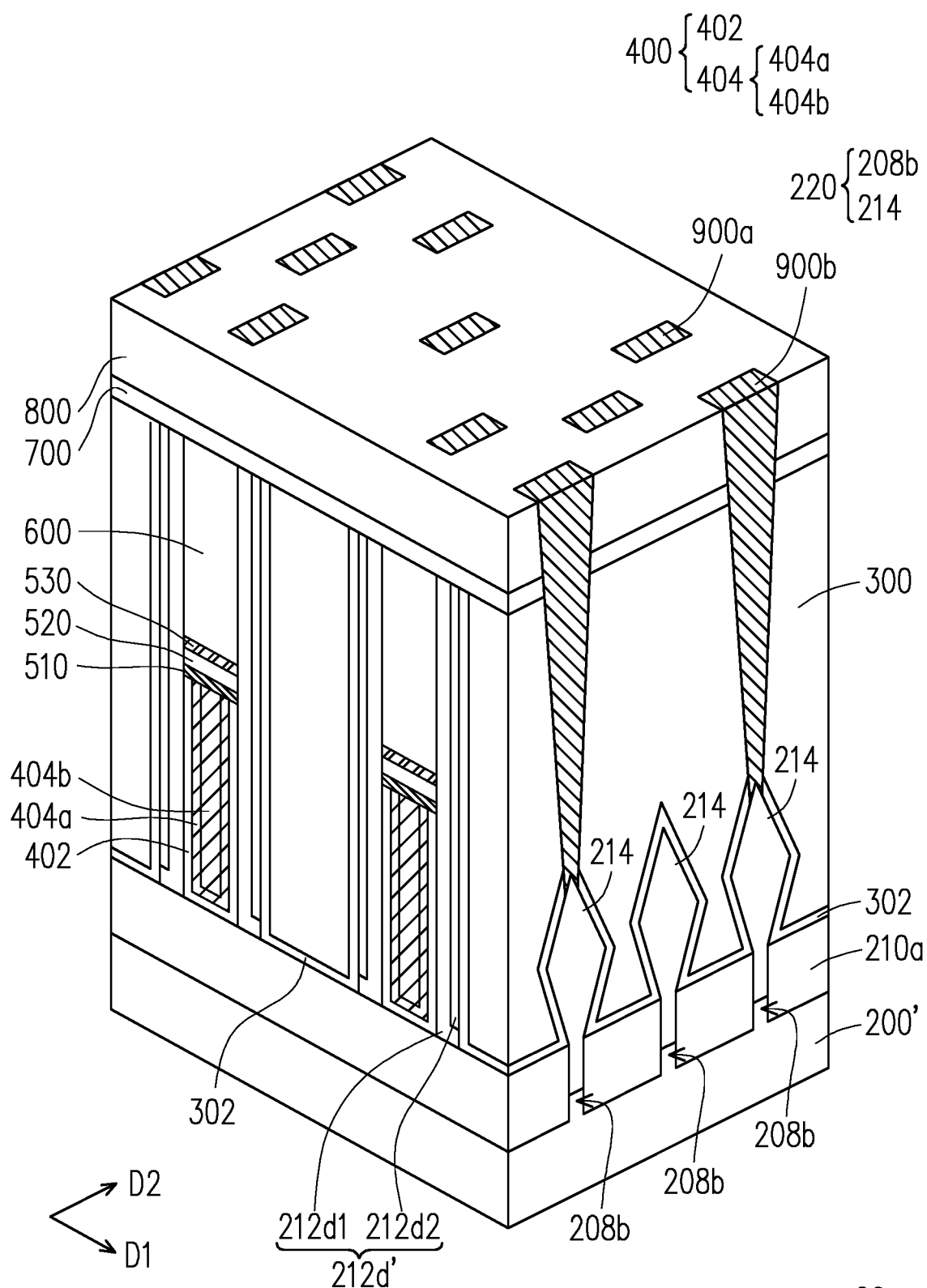
FIG. 3 is a cross-section view illustrating a semiconductor device in accordance with some embodiments of the disclosure.

FIG. 3 is a cross-section view illustrating a semiconductor device in accordance with some embodiments of the disclosure. It should be noted that, the embodiment of FIG. 3 adopts the reference numbers and part of the content in the embodiment of FIG. 1A to FIG. 1L, where identical or similar reference numbers are used to indicate identical or similar components, and repeated description for the same technical contents is omitted. The omitted part of the description can refer to the foregoing embodiments, which are not repeated in the following embodiments.

The different between the semiconductor device 20 in FIG. 3 and the semiconductor device 10 in FIG. 1L is that the spacers 212d' of the semiconductor device 20 includes a multi-layered structure.

Referring to FIG. 3, each of the spacers 212d' includes a first layer 212d1 and a second layer 212d2. The first layer 212d1 is disposed on the gate electrode 404 and the fin structures 208, and a portion of the first layer 212d1 is extending along a surface of the insulators 210a. The second layer 212d2 is disposed on the first layer 212d1. The material of the first layer 212d1 may be identical to or different from the material of the second layer 212d2. The first layer 212d1 can be protected by the dummy gate from wet etching process before the ion implantation process.

The first layers 212d1 (and the second layers 212d2) are treated by the ion implantation process with the molecular ions to reduce the dielectric constant of the first layers 212d1 (and the dielectric constant of the second layers 212d2). Fluorine implantation in the first layers 212d1 after removing the dummy gate electrode and before removing the dummy gate insulation can avoid flow integration issues effectively. Therefore, AC performance of the semiconductor device may be improved by parasitic capacitance reduction.

In some embodiment, by using the molecular ions in the ion implantation process P, the ion implantation process P can be precisely controlled. In some embodiment, the doping depth of the ion implantation process is smaller than the thickness of the first layers 212d1. That is, the second layers 212d2 may not be implanted with fluorine by the ion implantation process P. In other embodiment, the first layers 212d1 and the second layers 212d2 are both implanted with fluorine by the ion implantation process P.

Figure 4:
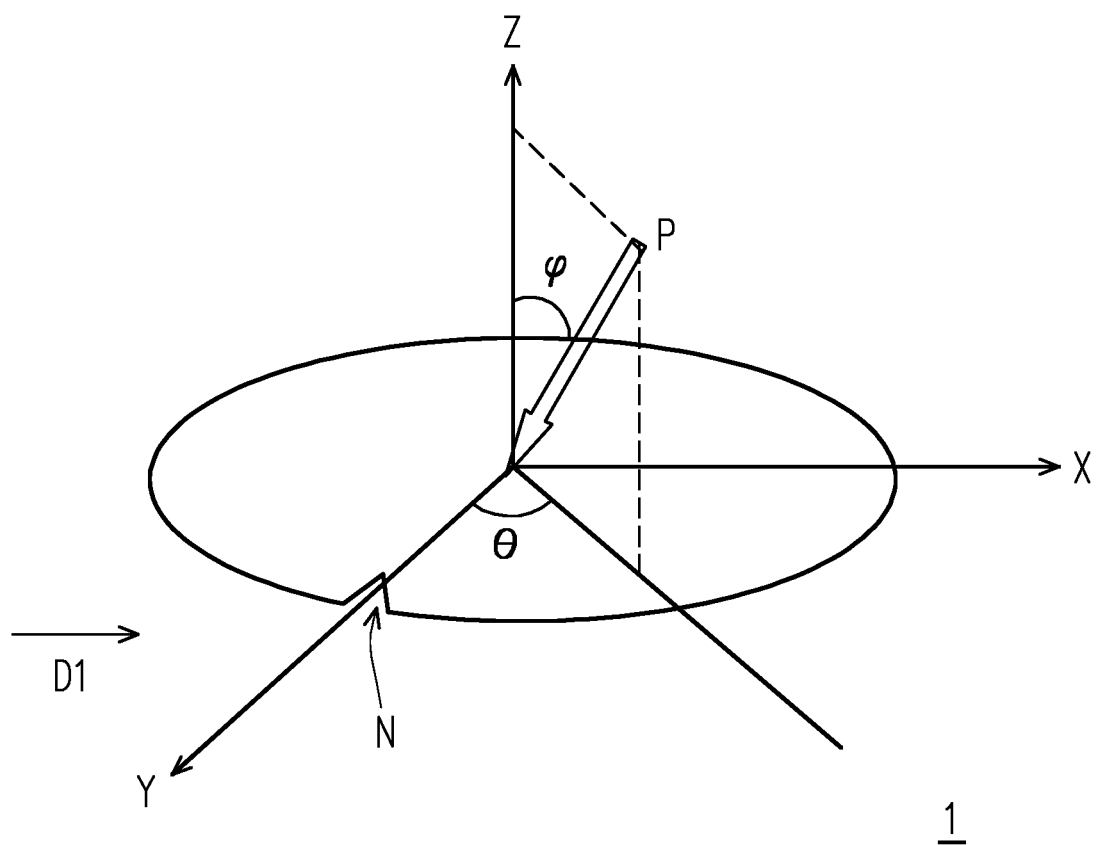
FIG. 4 is a perspective view illustrating an ion implantation process in accordance with some embodiments of the disclosure.
Figure 5A:
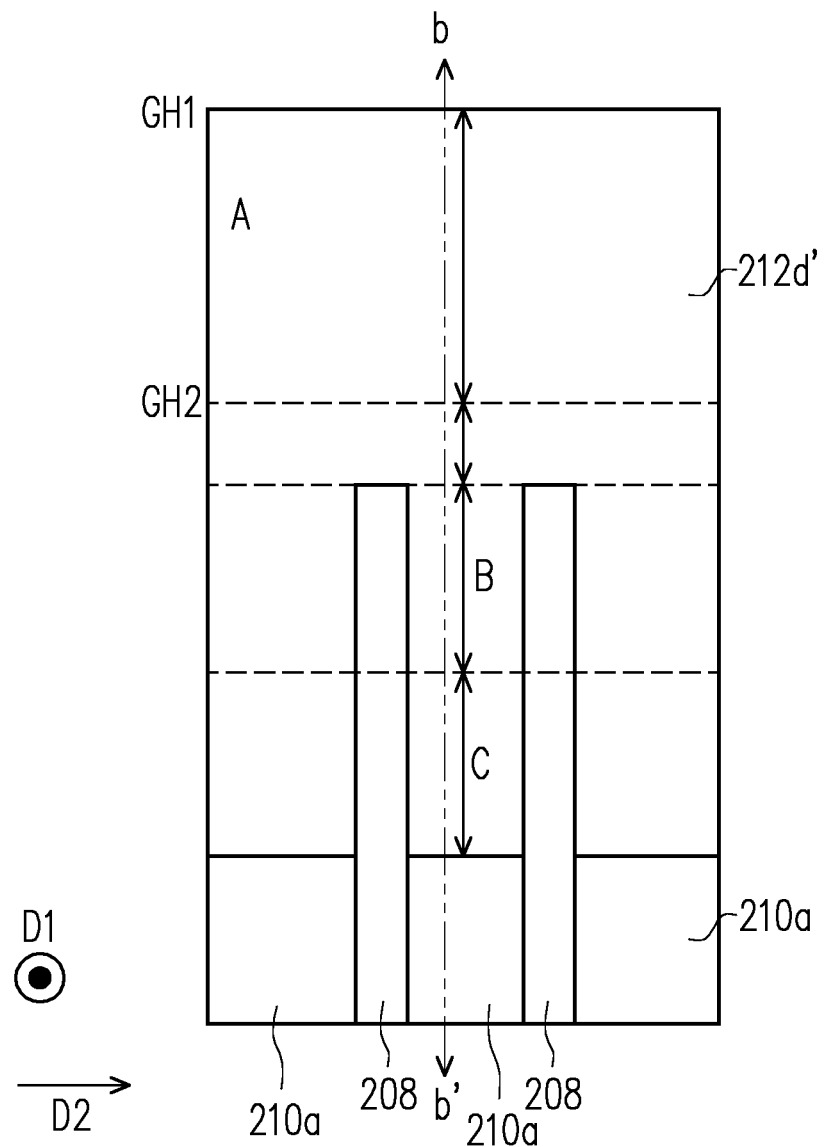
FIGS. 5A and 5B are a cross-section view illustrating a wafer after an ion implantation process in accordance with some embodiments of the disclosure.
Figure 5B:
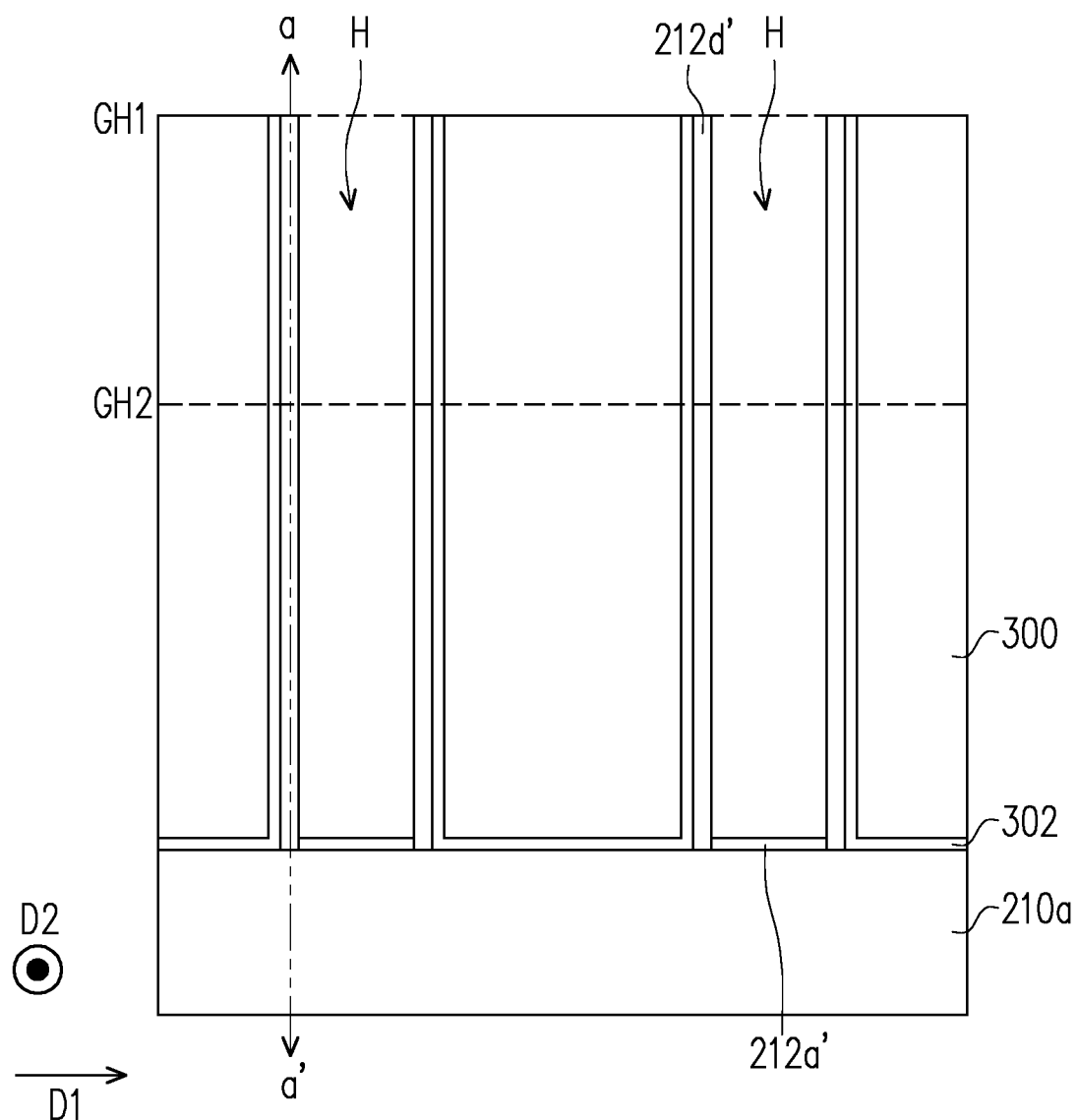

FIG. 4 is a perspective view illustrating an ion implantation process in accordance with some embodiments of the disclosure. FIGS. 5A and 5B are a cross-section view illustrating a wafer after an ion implantation process in accordance with some embodiments of the disclosure.

Referring to FIGS. 4, 5A and FIG. 5B, a wafer 1 including a plurality of spacers 212d' is provided.

In some embodiments, a dose of the ion implantation process P is in a range from about $5 \times 10^{14}$ cm$^{-2}$ to about $1 \times 10^{16}$ cm$^{-2}$, and an implant energy of the ion implantation process P is in a range from about 300 eV to about 3000 eV. The angle between the ion beam and the Z axis (the normal direction of the wafer 1) can be referred as the tilt angle φ. The angle between the ion beam and the Y axis (the direction from the center of the wafer 1 to a notch N of the wafer 1) on the X-Y plane can be referred as the twist angle θ. The extending direction (first direction D1) of the fin structures 208 is about parallel with the X axis and perpendicular with the Y axis.

The fluorine concentration of three different region A, B, and C in the space 212d' are measured. The region A is located between the top surface height GH2 of the preset gate electrode after etching (as shown in FIG. 1L) and the top surface height GH1 of the preset gate electrode before etching (as shown in FIG. 1K). The region B is located beside top portions of the fin structures 208. The region C is located beside bottom portions of the fin structures 208 protruding from the insulators 210a.

In one embodiment, the tilt angle φ of the ion implantation process P is from 0 degrees to 30 degrees. The twist angle θ of the ion implantation process P includes 0 degrees and 180 degrees, and the wafer 1 (or the ion beam) was rotated two times. A concentration of fluorine in the region A of the spacers 212d' is about $5 \times 10^{20}$ cm$^{-3}$. A concentration of fluorine in the region B of the spacers 212d' is about $2 \times 10^{20}$ cm$^{-3}$. A concentration of fluorine in the region C of the spacers 212d' is about $5 \times 10^{18}$ cm$^{-3}$.

In another embodiment, the tilt angle φ of the ion implantation process P is from 0 degrees to 30 degrees. The twist angle θ of the ion implantation process P includes 90 degrees and 270 degrees, and the wafer 1 (or the ion beam) was rotated two times. A concentration of fluorine in the region A of the spacers 212d' is about $3 \times 10^{19}$ cm$^{-3}$. A concentration of fluorine in the region B of the spacers 212d' is about $5 \times 10^{18}$ cm$^{-3}$. A concentration of fluorine in the region C of the spacers 212d' is smaller than $5 \times 10^{17}$ cm$^{-3}$.

In yet another embodiment, the tilt angle φ of the ion implantation process P is from 0 degrees to 30 degrees. The twist angle θ of the ion implantation process P includes 45 degrees, 135 degrees, 225 degrees, and 315 degrees, and the wafer 1 (or the ion beam) was rotated four times. A concentration of fluorine in the region A of the spacers 212d' is about $1 \times 10^{20}$ cm$^{-3}$. A concentration of fluorine in the region B of the spacers 212d' is about $2 \times 10^{19}$ cm$^{-3}$. A concentration of fluorine in the region C of the spacers 212d' is smaller than $5 \times 10^{17}$ cm$^{-3}$.

In some embodiments, a concentration of fluorine in the spacers 212d' beside top portions of the plurality of fin structures 208 is in a range from about $5 \times 10^{18}$ cm$^{-3}$ to about $2 \times 10^{20}$ cm$^{-3}$, and the dielectric constant of the spacers 212d' is reduced.

In accordance with some embodiments of the disclosure, a semiconductor device comprises a semiconductor substrate, a gate electrode, a gate insulation layer and spacers. The gate electrode is disposed on the semiconductor substrate. The gate insulation layer is disposed between the semiconductor substrate and the gate electrode. The spacers are disposed on the two sides of the gate electrode, wherein the spacers include fluorine ions distributed in the spacers, and the spacers that surround top portions of the fin structures have a fluorine ion concentration higher than that of the rest of the spacers.

In accordance with some embodiments of the disclosure, a manufacturing method of a semiconductor device, comprises the following steps: providing a semiconductor substrate; forming a dummy insulation layer and a dummy electrode sequentially stacked on the semiconductor substrate; forming spacers on sidewalls of the dummy electrode; removing the dummy electrode to exposes inner sidewalls of the spacers; and performing an ion implantation process to the inner sidewalls of the spacers and the dummy insulation layer.

In accordance with some embodiments of the disclosure, a manufacturing method of a semiconductor device comprises the following steps: providing a semiconductor substrate comprises parallel fin structures extending along a first direction; forming insulators on the semiconductor substrate and between the fin structures, wherein the fin structures protrudes from the insulators; forming a stack structure over the fin structures, wherein the stack structure extends along a second direction perpendicular to the first direction, and the stack structure comprises a dummy gate electrode and a dummy gate insulation layer; forming spacers on two opposite sides of the stack structure; forming an interlayer dielectric layer beside the spacers; removing the dummy gate electrode and leaving the spacers and the dummy gate insulation layer remained; performing an ion implantation process to the spacers by using molecular ions, wherein each of the molecular ions includes at least two fluorine atoms; forming a gate insulation layer between the spacers; and forming a gate electrode on the gate insulation layer.

In accordance with some embodiments of the disclosure, a manufacturing method of a semiconductor device comprises the following steps: providing a semiconductor substrate; forming a dummy strip on the semiconductor substrate, wherein the dummy strip comprises a dummy electrode and a dummy insulation layer; forming spacers on sidewalls of the dummy strip; removing the dummy electrode to form a hollow between the spacers, wherein the hollow exposes inner sidewalls of the spacers; and performing an ion implantation process on the inner sidewalls of the spacers by using molecular ions including at least one of $GeF_2^+$, $CF_3^+$, $NF_3+$, and $SiF_3+$.

In accordance with some embodiments of the disclosure, a semiconductor device comprises a semiconductor substrate, a gate electrode, a gate insulation layer, and spacers. The gate electrode is disposed on the semiconductor substrate. The gate insulation layer is disposed between the semiconductor substrate and the gate electrode. The spacers are disposed on the two sides of the gate electrode, wherein at least a portion of fluorine ions of molecular ions are implanted into the spacers, and each of the molecular ions includes more than one of fluorine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor device, comprising:
providing a semiconductor substrate;
forming an insulator on the semiconductor substrate;
forming a dummy insulation layer and a dummy electrode sequentially stacked on the semiconductor substrate and the insulator;
forming spacers on sidewalls of the dummy electrode;
sequentially forming an etch stop layer and an interlayer dielectric layer over the top surface of the insulator, wherein the etch stop layer is disposed between the spacers and the interlayer dielectric layer and between the insulator and the interlayer dielectric layer;
removing the dummy electrode to exposes inner sidewalls of the spacers; and
performing an ion implantation process to the inner sidewalls of the spacers and the dummy insulation layer.

2. The manufacturing method of claim 1, wherein the ion implantation process is performed by using molecular ions, wherein each of the molecular ions includes at least two fluorine atoms, and the molecular ions including at least one of $GeF_2^+$, $CF_3^+$ and $NF_3^+$.

3. The manufacturing method of claim 2, wherein an implant energy of the ion implantation process is in a range from about 300 eV to about 3000 eV, a dose of the ion implantation process is in a range from about $5\times10^{14}$ $cm^{-2}$ to about $1\times10^{16}$ $cm^{-2}$, and a concentration of fluorine in the spacers surrounding top portions of fin structures of the semiconductor substrate is in a range from about $5\times10^{18}$ $cm^{-3}$ to about $2\times10^{20}$ $cm^{-3}$.

4. The manufacturing method of claim 2, wherein at least a portion of bonding between the fluorine atoms and cations in the molecular ions are broken after the molecular ions hitting the spacers, and at least a portion of the fluorine atoms are incorporated into the spacers.

5. The manufacturing method of claim 1, wherein each of the spacers comprises a multi-layered structure.

6. The manufacturing method of claim 1, wherein a material of the spacers comprises silicon oxide, silicon nitride, SiCN, SiCON, or a combination thereof.

7. The manufacturing method of claim 1, wherein the ion implantation process is performed to the dummy insulation layer.

8. A manufacturing method, comprising:
providing a semiconductor substrate comprises fin structures;
forming insulators on the semiconductor substrate and between the fin structures, wherein the fin structures protrude from the insulators;
forming a stack structure over the fin structures, wherein an extending direction of the stack structure is different with an extending direction of the fin structures, and the stack structure comprises a dummy gate electrode and a dummy gate insulation layer;
forming spacers on two opposite sides of the stack structure;
forming an etch stop layer directly connected with outer sidewalls of the spacers and the top surface of the insulators;
forming an interlayer dielectric layer on the etch stop layer, wherein the etch stop layer is disposed between the spacers and the interlayer dielectric layer and between the insulator and the interlayer dielectric layer;
removing the dummy gate electrode and leaving the spacers and the dummy gate insulation layer remained;
performing an ion implantation process to the spacers by using molecular ions, wherein each of the molecular ions includes at least two fluorine atoms;
forming a gate insulation layer between the spacers; and
forming a gate electrode on the gate insulation layer.

9. The manufacturing method of claim 8, wherein the molecular ions are $GeF_2^+$, $CF_3^+$, or $NF_3^+$.

10. The manufacturing method of claim 8, wherein an implant energy of the ion implantation process is in a range from about 300 eV to about 3000 eV, a dose of the ion implantation process is in a range from about $5\times10^{14}$ $cm^{-2}$ to about $1\times10^{16}$ $cm^{-2}$, and a concentration of fluorine in the spacers surrounding top portions of the fin structures is in a range from about $5\times10^{18}$ $cm^{-3}$ to about $2\times10^{20}$ $cm^{-3}$.

11. The manufacturing method of claim 8, further comprising removing the dummy gate insulation layer after the ion implantation process.

12. The manufacturing method of claim 11, wherein the ion implantation process is performed to the dummy gate insulation layer and the spacers.

13. The manufacturing method of claim 8, further comprising heating the spacers under 100° C. to 500° C. during performing the ion implantation process.

14. A manufacturing method, comprising:
providing a substrate;
forming a dummy structure on the substrate, wherein the dummy structure comprises a dummy electrode and a dummy insulation layer;
forming spacers on sidewalls of the dummy structure;
removing the dummy electrode to form a hollow between the spacers, wherein the hollow exposes inner sidewalls of the spacers; and
performing an ion implantation process to the inner sidewalls of the spacers by using molecular ions including at least two fluorine atoms, wherein the molecular ions are $GeF_2^+$, $CF_3^+$, or $NF_3^+$.

15. The manufacturing method of claim 14, further comprising sequentially forming a gate insulation layer and a gate electrode between the spacers after performing the ion implantation process.

16. The manufacturing method of claim 15, further comprising:
- forming insulators on the substrate;
- forming an etch stop layer blanket on outer sidewalls of the spacers and the top surface of the insulators; and
- forming an interlayer dielectric layer on the etch stop layer before removing the dummy electrode.

17. The manufacturing method of claim 14, further comprising heating the spacers under 100° C. to 500° C. while performing the ion implantation process.

18. The manufacturing method of claim 14, wherein a dose of the ion implantation process is in a range from about $5 \times 10^{14}$ cm$^{-2}$ to about $1 \times 10^{16}$ cm$^{-2}$, and a concentration of fluorine in the spacers surrounding top portions of the fin structures of the semiconductor substrate is in a range from about $5 \times 10^{18}$ cm$^{-3}$ to about $2 \times 10^{20}$ cm$^{-3}$.

19. The manufacturing method of claim 14, wherein an implant energy of the ion implantation process is in a range from about 300 eV to about 3000 eV.

20. The manufacturing method of claim 14, wherein the ion implantation process is performed to include multiple steps with different tilt angles or twist angles.

* * * * *